US006678868B2

(12) United States Patent
Lam

(10) Patent No.: US 6,678,868 B2
(45) Date of Patent: Jan. 13, 2004

(54) USING BOOLEAN EXPRESSIONS TO REPRESENT SHAPES WITHIN A LAYOUT OF AN INTEGRATED CIRCUIT

(75) Inventor: William K. Lam, Newark, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 105 days.

(21) Appl. No.: 10/124,586

(22) Filed: Apr. 17, 2002

(65) Prior Publication Data

US 2003/0200512 A1 Oct. 23, 2003

(51) Int. Cl.[7] .............................................. G06F 17/50
(52) U.S. Cl. ............................................. 716/3; 716/18
(58) Field of Search ........................................ 716/1–18

(56) References Cited

U.S. PATENT DOCUMENTS

| 4,792,909 A | * | 12/1988 | Serlet ........................... 716/10 |
| 5,461,577 A | * | 10/1995 | Shaw et al. .................... 716/17 |
| 6,530,073 B2 | * | 3/2003 | Morgan ......................... 716/18 |

OTHER PUBLICATIONS

Just et al., "Palace: A Layout Ghenerator for SCVS Logic Blocks," IEEE, Jun. 28, 1990, pp. 468–473.*
Jaekel et al., "A Layout Influenced Factorization of Boolean Functions," IEEE, Jan. 1994, pp. 251–254.*
Liao et al., "Boolean Behavior Extraction from Circut Layout," IEEE, May 1989, pp. 139–143.*
Kwon et al., "An Algorithm for Optimal Layouts of CMOS Complex Logic Modules," IEEE, Jun. 1991, pp. 3126–3129.*
Brian C. H. Turton, "Extending Quine–McCluskey for Exclusive–Or Logic Synthesis," IEEE, Feb. 1996, pp. 81–85.*
Johnsson et al, "On the Conversion Between Binary Code and Binary–Reflected Gray Code on Binary Cubes," IEEE, Jan. 1995, pp. 47–53.*
Bogdan J Falkowski, "Generation of Gray Code Ordered Walsh Function by Symmetric and Shift Copies," IEEE, 1993, pp. 758–761.*
Quintana et al., "Reed–Muller Descriptions of Symmetric Functions," IEEE, May 6–9, 2001, pp. IV–682–IV–685.*

* cited by examiner

Primary Examiner—Vuthe Siek
(74) Attorney, Agent, or Firm—Park, Vaughan & Fleming LLP

(57) ABSTRACT

One embodiment of the present invention provides a system that facilitates representing a shape within a layout of an integrated circuit using a Boolean expression. The system operates by first receiving a representation of the shape and then converting the representation of the shape into a Boolean expression that is formed using a Boolean coordinate system expressed in a two-dimensional Gray code. The system then performs operations on the shape by performing Boolean operations on the Boolean expression for the shape.

33 Claims, 5 Drawing Sheets

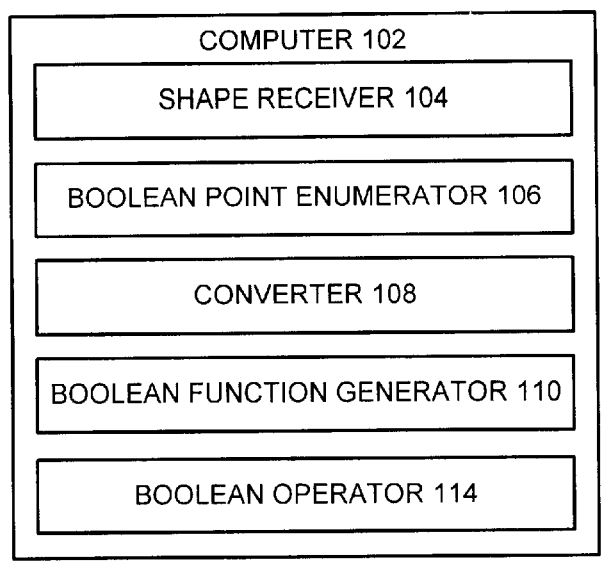
FIG. 1
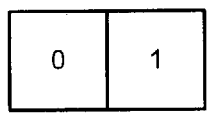
FIG. 2A
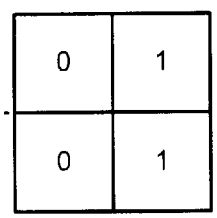
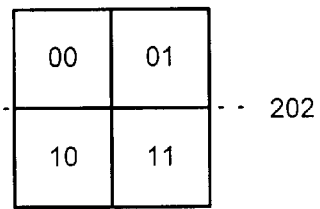
FIG. 2B  FIG. 2C

| 000 | 001 | 101 | 100 |
|-----|-----|-----|-----|
| 010 | 011 | 111 | 110 |

| 0000 | 0001 | 0101 | 0100 |
|------|------|------|------|
| 0010 | 0011 | 0111 | 0110 |
| 1010 | 1011 | 1111 | 1110 |
| 1000 | 1001 | 1101 | 1100 |

| 00000 | 00001 | 00101 | 00100 | 10100 | 10101 | 10001 | 10000 |
|-------|-------|-------|-------|-------|-------|-------|-------|
| 00010 | 00011 | 00111 | 00110 | 10110 | 10111 | 10011 | 10010 |
| 01010 | 01011 | 01111 | 01110 | 11110 | 11111 | 11011 | 11010 |
| 01000 | 01001 | 01101 | 01100 | 11100 | 11101 | 11001 | 11000 |

| | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 7 | 0000100 | 0001100 | 0011100 | 0010100 | 0110100 | 0111100 | 0101100 | 0100100 | 1100100 | 1101100 | 1111100 | 1110100 | 1010100 | 1011100 | 1001100 | 1000100 |
| 6 | 0000101 | 0001101 | 0011101 | 0010101 | 0110101 | 0111101 | 0101101 | 0100101 | 1100101 | 1101101 | 1111101 | 1110101 | 1010101 | 1011101 | 1001101 | 1000101 |
| 5 | 0000111 | 0001111 | 0011111 | 0010111 | 0110111 | 0111111 | 0101111 | 0100111 | 1100111 | 1101111 | 1111111 | 1110111 | 1010111 | 1011111 | 1001111 | 1000111 |
| 4 | 0000110 | 0001110 | 0011110 | 0010110 | 0110110 | 0111110 | 0101110 | 0100110 | 1100110 | 1101110 | 1111110 | 1110110 | 1010110 | 1011110 | 1001110 | 1000110 |
| 3 | 0000010 | 0001010 | 0011010 | 0010010 | 0110010 | 0111010 | 0101010 | 0100010 | 1100010 | 1101010 | 1111010 | 1110010 | 1010010 | 1011010 | 1001010 | 1000010 |
| 2 | 0000011 | 0001011 | 0011011 | 0010011 | 0110011 | 0111011 | 0101011 | 0100011 | 1100011 | 1101011 | 1111011 | 1110011 | 1010011 | 1011011 | 1001011 | 1000011 |
| 1 | 0000001 | 0001001 | 0011001 | 0010001 | 0110001 | 0111001 | 0101001 | 0100001 | 1100001 | 1101001 | 1111001 | 1110001 | 1010001 | 1011001 | 1001001 | 1000001 |
| 0 | 0000000 | 0001000 | 0011000 | 0010000 | 0110000 | 0111000 | 0101000 | 0100000 | 1100000 | 1101000 | 1111000 | 1110000 | 1010000 | 1011000 | 1001000 | 1000000 |

USING BOOLEAN EXPRESSIONS TO REPRESENT SHAPES WITHIN A LAYOUT OF AN INTEGRATED CIRCUIT

BACKGROUND

1. Field of the Invention

The present invention relates to the process of designing an integrated circuit. More specifically the present invention relates to a method and an apparatus that uses Boolean expressions to represent shapes within a layout of an integrated circuit.

2. Related Art

As rapid advances in semiconductor technology make it possible to incorporate larger amounts of circuitry onto a semiconductor chip, it is becoming increasingly more difficult to generate a layout for circuit components on the semiconductor chip. This difficulty is exacerbated by differences between representations of the logical design of the circuitry and the physical layout of the circuitry.

The process of creating an integrated circuit typically starts with a logical description of the circuit. This logical description is subsequently transformed into a register transfer language (RTL) description. This RTL description is further transformed into a gate-level description of the circuit. Collectively, these steps are referred to as the "logical design" of the integrated circuit.

Upon completion of the logical design, the logical design is transformed into a physical design. Note that there exists a disparity between representations used in the logical design and the physical design. The logical design is typically represented in the Boolean domain, while the physical design is typically represented in the real-value domain. These different representations make the process of converting the logical design into the physical design difficult and time-consuming. Moreover, operations on the physical design involve numerical operations on real values. These numerical operations are much slower than the logical operations involving logical values that take place during the logical design process.

What is needed is a method and an apparatus that facilitates performing operations on the physical design of an integrated circuit without the problems described above.

SUMMARY

One embodiment of the present invention provides a system that facilitates representing a shape within a layout of an integrated circuit using a Boolean expression. The system operates by first receiving a representation of the shape and then converting the representation of the shape into a Boolean expression that is formed using a Boolean coordinate system expressed in a two-dimensional Gray code. The system then performs operations on the shape by performing Boolean operations on the Boolean expression for the shape.

In one embodiment of the present invention, the system incorporates the shape into the layout of the integrated circuit by incorporating the Boolean expression for the shape into a Boolean expression for the layout.

In one embodiment of the present invention, the system expresses multiple layers on a physical chip layout by using additional bits in the two-dimensional Gray code.

In one embodiment of the present invention, the system creates a Boolean function using the Boolean expression, whereby the Boolean function can be used to determine if a point is inside the shape.

In one embodiment of the present invention, performing operations on the shape can include performing AND operations, OR operations, EXCLUSIVE-OR operations, CONTAINMENT operations, or EQUIVALENCE operations.

In one embodiment of the present invention, the system defines a non-rectangular area by combining Boolean expressions of rectangular areas.

In one embodiment of the present invention, if the shape is a rectangle, the shape is represented using coordinates for each corner of the rectangle.

In one embodiment of the present invention, if the shape has a constant width, the shape is represented using coordinates for each end of the shape.

BRIEF DESCRIPTION OF THE FIGURES

FIG. 1 illustrates computer 102 in accordance with an embodiment of the present invention.

FIG. 2A illustrates two numbered points in accordance with an embodiment of the present invention.

FIG. 2B illustrates the points of FIG. 2A reflected about a horizontal line in accordance with an embodiment of the present invention.

FIG. 2C illustrates the points of FIG. 2B with prefixed zeros and ones in accordance with an embodiment of the present invention.

FIG. 2D illustrates the points of FIG. 2C reflected about a vertical line in accordance with an embodiment of the present invention.

FIG. 2E illustrates the points of FIG. 2D reflected about a horizontal line in accordance with an embodiment of the present invention.

FIG. 2F illustrates the points of FIG. 2E reflected about a vertical line in accordance with an embodiment of the present invention.

FIG. 5 illustrates an alternate example of determining containment in accordance with an embodiment of the present invention.

DETAILED DESCRIPTION

Figure 3:
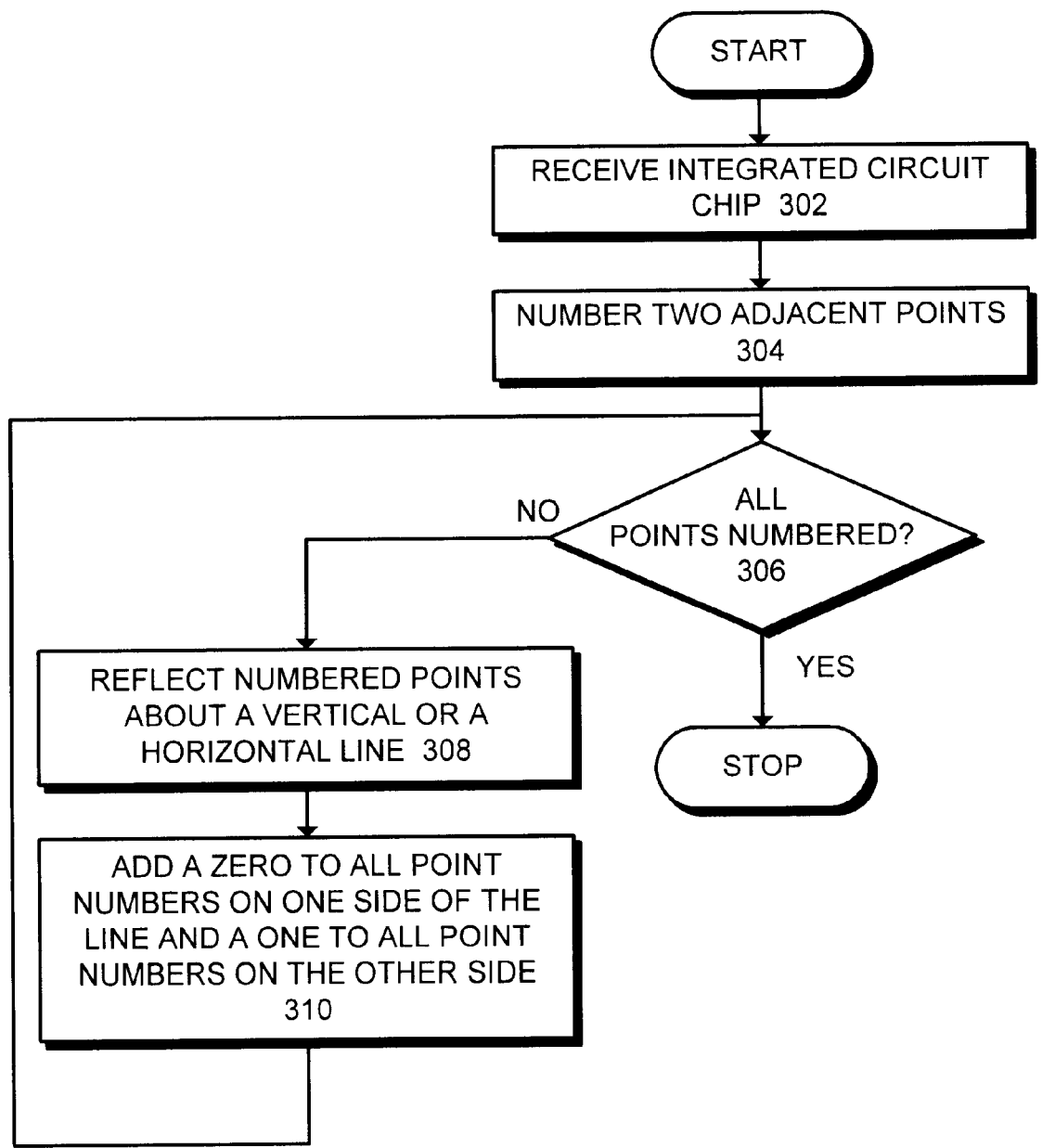
FIG. 3 is a flowchart illustrating the process of numbering a plane with a two-dimensional Gray code in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Computer System

FIG. 1 illustrates computer 102 in accordance with an embodiment of the present invention. Computer 102 can generally include any type of computer system, including, but not limited to, a computer system based on a microprocessor, a mainframe computer, a digital signal processor, a portable computing device, a personal organizer, a device controller, and a computational engine within an appliance.

Computer 102 contains a number of code modules that perform various functions to facilitate using Boolean representations for shapes in a layout of an integrated circuit. These code modules include shape receiver 104, Boolean point enumerator 106, converter 108, Boolean function generator 110, and Boolean operator 114. Shape receiver 104 receives shapes from an integrated circuit design system. Typically, these shapes are logical representations of circuit elements for an integrated circuit.

Boolean point enumerator 106 generates unique numbers for each point on the integrated circuit chip. The unique numbers are derived using a two-dimensional Gray code as described below in conjunction with FIGS. 2A–2F. This Gray code can be extended to a three-dimensional Gray code by adding bits for multiple layers and extending the method described below into the third dimension.

Converter 108 converts the representation of a shape received by shape receiver 104 into a Boolean expression that is formed using the Gray code coordinate system provided by Boolean point enumerator 106. These Boolean expressions can be used to describe areas on the integrated circuit chip and can be operated upon using Boolean operators to combine shapes, thereby allowing arbitrary shapes to be encoded as Boolean expressions.

Boolean function generator 110 combines these Boolean expressions into functions. For example, one function can be used to determine if a point is within a shape. When this function is applied to the coded number of a point, it produces a true or a false indication of whether the point is within the shape.

Boolean operator 114 performs operations such as AND, OR, XOR, and EQUIVALENCE for purposes such as combining shapes and modifying shapes. Note that these Boolean operations operate on strings of bits instead of numerical values.

Numbering the Layout

FIGS. 2A–2F illustrate how a two-dimensional Gray code is constructed for numbering the points on the integrated circuit. FIG. 2A illustrates two numbered points in accordance with an embodiment of the present invention. Note that the points are shown as rectangles to provide clarity to the figures. Furthermore, note that these points may be densely packed on the surface of an integrated circuit chip. The points shown in FIG. 2A are numbered 0 and 1.

FIG. 2B illustrates the points of FIG. 2A reflected about a horizontal line in accordance with an embodiment of the present invention. Horizontal line 202 has been placed next to the numbered points of FIG. 2A and the point numbers have been reflected across horizontal line 202. This results in four numbered points, however two points are numbered zero and two points are numbered one. To provide unique numbers and to provide a two-dimensional Gray code numbering, the numbers are augmented with prefixing zeros and ones as described below in conjunction with FIG. 2C.

FIG. 2C illustrates the points of FIG. 2B with prefixed zeros and ones in accordance with an embodiment of the present invention. Each point on one side of horizontal line 202 receives a prefixing zero, while each point on the other side of horizontal line 202 receives a prefixing one. Note that using prefix values is not the only method for providing a unique two-dimensional Gray code numbering for the integrated circuit surface. For example, the zeros and ones could be added as a postfix to the original numbers rather than a prefix.

FIG. 2D illustrates the points of FIG. 2C reflected about a vertical line in accordance with an embodiment of the present invention. Vertical line 204 is placed adjacent to the points of FIG. 2C and the point numbers are reflected across vertical line 204. After the point numbers have been reflected, prefixing zeros and ones are added with zeros prefixed on the left of vertical line 204 and ones prefixed on the right of vertical line 204. Note that prior to prefixing the zeros and ones, the right side is a mirror image of the left side.

FIG. 2E illustrates the points of FIG. 2D reflected about a horizontal line in accordance with an embodiment of the present invention. The point numbers are reflected about horizontal line 206 in a similar manner to that described above. After the point numbers have been reflected, prefixing zeros and ones are also added in a similar manner.

FIG. 2F illustrates the points of FIG. 2E reflected about a vertical line in accordance with an embodiment of the present invention. The point numbers are reflected about vertical line 208 in a similar manner to that described above. After the point numbers have been reflected, prefixing zeros and ones are also added in a similar manner. These operations of reflecting the current point numbers across a vertical or horizontal line and then prefixing zeros to the numbers on one side of the line and prefixing ones to the numbers on the other side of the line continues until the total surface has been numbered. Once the entire surface has been numbered, the process can be continued to provide numbering for additional layers of the integrated circuit. To number the different layers, the process continues by reflecting the surface numbers across a plane parallel to the surface and then adding zeros on one side of the plane and ones on the other side of the plane in a manner similar to that described above. Note that other means can be used to provide the two-dimensional Gray code numbering.

Numbering a Plane

FIG. 3 is a flowchart illustrating the process of numbering a plane with a two-dimensional Gray code in accordance with an embodiment of the present invention. The system starts by receiving a representation of an integrated circuit chip (step 302). Next, the system numbers two points within the chip (step 304). One of these points is numbered zero and the other point is numbered one.

The system then determines if all of the points have been numbered (step 306). If so, the process is ended. Otherwise, the system reflects the numbered points about a vertical or a horizontal line as described above with respect to FIGS. 2A–2F (step 308). Next, the system adds a zero to each point number on one side of the line and adds a one to each point number on the other side of the line (step 310). The process then continues at step 306 to determine if all points have been numbered.

Incorporating a Shape

Figure 4:
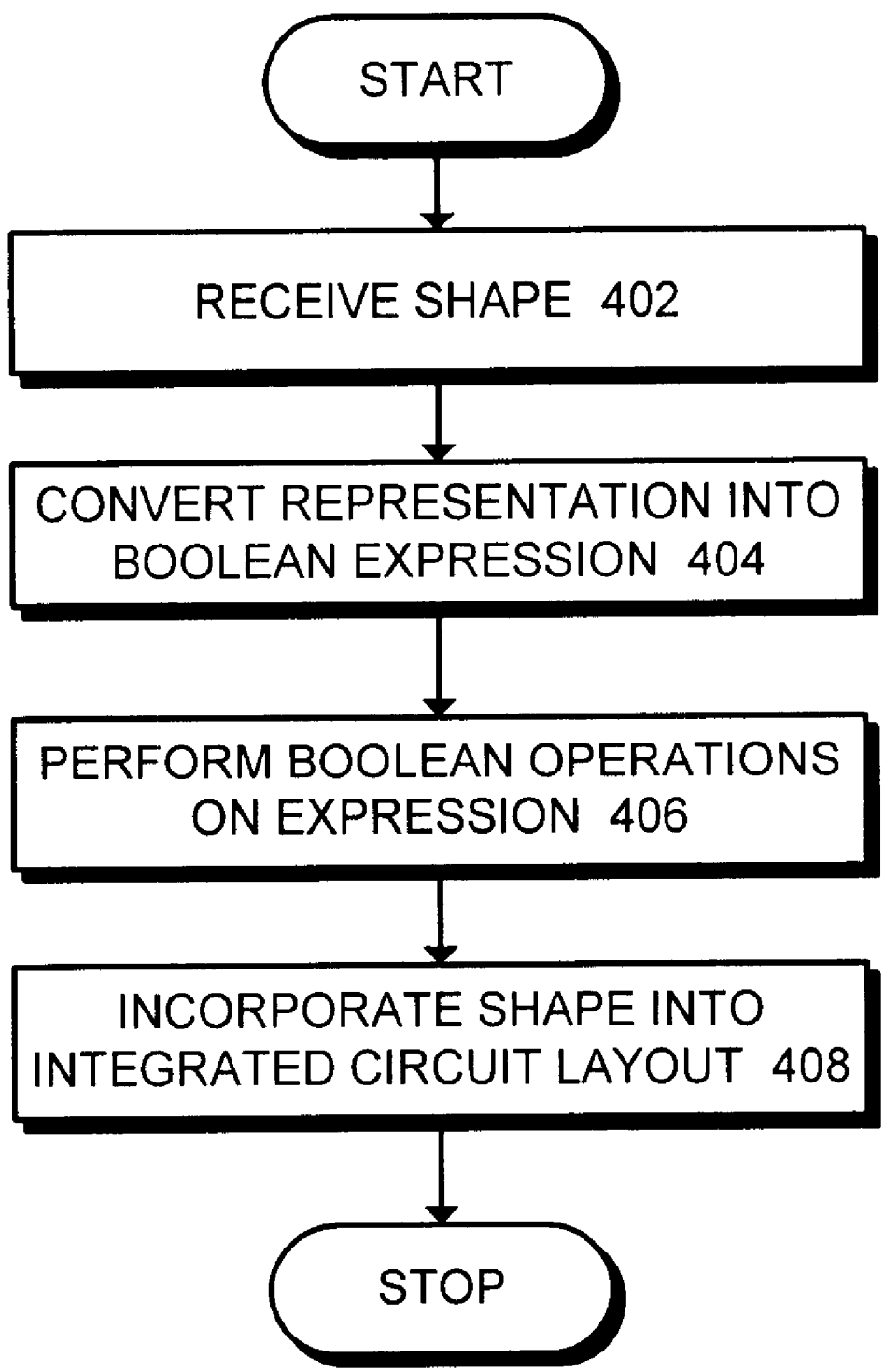
FIG. 4 is a flowchart illustrating the process of incorporating a shape into an integrated circuit layout in accordance with an embodiment of the present invention.

FIG. 4 is a flowchart illustrating the process of incorporating a shape into an integrated circuit layout in accordance with an embodiment of the present invention. The system starts by receiving a representation of a shape to incorporate into an integrated circuit layout (step 402). Next, the system converts the representation into a Boolean expression (step 404). The system then performs Boolean operations on the shape by manipulating the Boolean expressions (step 406). These manipulations can include determining if a point within the shape is included in the integrated circuit layout. Finally, the system incorporates the shape into the integrated circuit layout (step 408).

EXAMPLES

This example illustrates the process of determining if a point is within a shape on an integrated circuit chip. Referring to FIG. 2F, we start with a shape that includes points 00100, 00110, 01110, 01100, 10110, 11110, 10111, and 11111. These points include two rectangular areas: 00100, 00110, 01110, and 01100; and 10110, 11110, 10111, and 11111. Each of these points can be identified using a string of variables $X_1X_2X_3X_4X_5$. For example, the points of the first area, 00100, 00110, 01110, and 01100, can be described with the Boolean expressions $\bar{X}_1\bar{X}_2X_3\bar{X}_4\bar{X}_5$ $\bar{X}_1\bar{X}_2X_3X_4\bar{X}_5$, $\bar{X}_1X_2X_3X_4\bar{X}_5$, and $\bar{X}_1X_2X_3\bar{X}_4\bar{X}_5$ respectively. Combining these expressions yields:

$$\bar{X}_1\bar{X}_2X_3\bar{X}_4\bar{X}_5+\bar{X}_1\bar{X}_2X_3X_4\bar{X}_5+\bar{X}_1X_2X_3X_4\bar{X}_5+\bar{X}_1X_2X_3\bar{X}_4\bar{X}_5=\bar{X}_1X_3\bar{X}_5.$$

The points of the second area can be described with the Boolean expressions $$X_1\bar{X}_2X_3X_4\bar{X}_5, X_1X_2X_3X_4\bar{X}_5, X_1\bar{X}_2X_3X_4X_5, \text{ and } X_1X_2X_3X_4X_5.$$

Combining these expressions yields:

$$X_1\bar{X}_2X_3X_4\bar{X}_5+X_1X_2X_3X_4\bar{X}_5+X_1\bar{X}_2X_3X_4X_5+X_1X_2X_3X_4X_5=X_1X_3X_4.$$

Combining expressions for the two rectangular areas yields the following function:

$$f(X)=\bar{X}_1X_3\bar{X}_5+X_1X_3X_4.$$

This function can be used to determine if a point lies within the combination of the two areas. For example, applying this function to point 01000, which is outside of the area yields: $f(X)=101+000=0$. The zero indicates that the point is outside of the area. Applying the function to point 11110, which is inside the area yields: $f(X)=011+111=1$. The 1 indicates that the point is inside the area.

FIG. 5 illustrates an alternate example for determining containment in accordance with an embodiment of the present invention. The rectangle shown is sixteen units wide and eight units high and requires four bits to encode the length and three bits to encode the length. Thus a total of seven bits is needed to encode a point within this rectangle. Specifically, the x-axis (length includes the points 0000, 0001, 0011, 0010, 0110, 0111, 0101, 0100, 1100, 1101, 1111, 1110, 1010, 1011, 1001, and 1000. The y-axis (width) includes the points 000, 001, 011, 010, 110, 111, 101, and 100.

In this example, the Gray code for the point is computed in an alternative manner. First, the Gray codes for the x and y coordinates are computed separately. Next, the Gray codes for the x and y coordinates are concatenated to form the Gray code for the point. The point (3, 5) is thus encoded as 0010111, where the first four bits come from the x-axis and the next three bits come from the y-axis. Three in the x-axis is encoded as 0010, while 5 in the y-axis is encoded 111. Concatenating these values yields 0010111.

There are two steps to derive the function $f$. First, assume the corners are fixed; second, enumerate all possible corner points. Let $P_1, \ldots, P_n$ be the variables for the corners and R the region defined by the corner variables. Then $f$, bounded by the corners $C_1, \ldots, C_n$, is given by $f=P_1==C_1), \ldots, (P_n==C_n)(P$ is inside R).

The Boolean function for P is inside R is simply the sum of all points inside R. The equivalence relation operator, ==, is the bit-wise exclusive-NOR (XNOR), i.e. it yields 1 if and only if all corresponding bits of the two operands are identical. For instance, P==(3,5) is the Boolean function P XNOR 00100111.

Given a rectangle with corners $C_1=(0,0)$, $C_2=(0,1)$, $C_3=(2,1)$, and $C_4=(2,0)$, in the sixteen by eight domain illustrated in FIG. 5, the points inside of R are (0,0), (1,0), (2,0), (0,1), (1,1), and (2,1). Then $f(P1,P2,P3,P4,P)=(P_1=C_1),(P_2=C_2)(P_3=C_3),(P_4==C_4)\{(P=0,0)+(P=1,0)+(P=2,1)+(P=2,0)$, where + is the Boolean OR.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for representing a shape within a layout of an integrated circuit using a Boolean expression, comprising:
   receiving a representation of the shape;
   converting the representation into the Boolean expression, wherein the Boolean expression is formed using a Boolean coordinate system expressed in a two-dimensional Gray code; and
   performing an operation on the shape by performing a Boolean operation on the Boolean expression for the shape.

2. The method of claim 1, wherein converting the representation into the Boolean expression involves numbering points in the layout with Gray code values by:
   starting with a sub-region of the layout that already has Gray code values; and
   forming Gray code values for a larger sub-region of the layout by,
      reflecting Gray codes values for the sub-region about a horizontal or vertical axis, and
      prefixing Gray code values on one side of the axis with 0 values and prefixing Gray code values on the other side of the axis with 1 values to form Gray code values for the larger sub-region of the layout.

3. The method of claim 1, wherein converting the representation into the Boolean expression involves determining the Gray code value for a point in the layout by concatenating a Gray code value for the x-coordinate for the point with a Gray code value for the y-coordinate for the point.

4. The method of claim 1, further comprising incorporating the shape into the layout of the integrated circuit by incorporating the Boolean expression for the shape into a Boolean expression for the layout.

5. The method of claim 1, further comprising representing multiple layers in the layout by reflecting Gray code numbers across a plane parallel to the surface of the layout and then adding zeros on one side of the plane and ones on the other side of the plane to produce a three-dimensional Gray code.

6. The method of claim 1, further comprising creating a Boolean function using the Boolean expression, whereby the Boolean function can be used to determine if a point is inside the shape.

7. The method of claim 6,
wherein the Boolean function receives four inputs specifying four corners that define a rectangular region R, and a fifth input specifying a point P; and
wherein the Boolean function evaluates to TRUE if the point P is contained within the rectangular region R.

8. The method of claim 1, wherein performing the operation includes performing one of, an AND operation, an OR operation, an EXCLUSIVE-OR operation, a CONTAINMENT operation, and an EQUIVALENCE operation.

9. The method of claim 8, further comprising defining a non-rectangular area by combining Boolean expressions of multiple rectangular areas.

10. The method of claim 1, wherein if the shape is a rectangle, the shape can be represented using coordinates for each corner of the rectangle.

11. The method of claim 1, wherein if the shape has a constant width, the shape can be represented using coordinates for each end of the shape.

12. A computer-readable storage medium storing instructions that when executed by a computer cause the computer to perform a method for representing a shape within a layout of an integrated circuit using a Boolean expression, the method comprising:
receiving a representation of the shape;
converting the representation into the Boolean expression, wherein the Boolean expression is formed using a Boolean coordinate system expressed in a two-dimensional Gray code; and
performing an operation on the shape by performing a Boolean operation on the Boolean expression for the shape.

13. The computer-readable storage medium of claim 12, wherein converting the representation into the Boolean expression involves numbering points in the layout with Gray code values by:
starting with a sub-region of the layout that already has Gray code values; and
forming Gray code values for a larger sub-region of the layout by,
reflecting Gray codes values for the sub-region about a horizontal or vertical axis, and
prefixing Gray code values on one side of the axis with 0 values and prefixing Gray code values on the other side of the axis with 1 values to form Gray code values for the larger sub-region of the layout.

14. The computer-readable storage medium of claim 12, wherein converting the representation into the Boolean expression involves determining the Gray code value for a point in the layout by concatenating a Gray code value for the x-coordinate for the point with a Gray code value for the y-coordinate for the point.

15. The computer-readable storage medium of claim 12, the method further comprising incorporating the shape into the layout of the integrated circuit by incorporating the Boolean expression for the shape into a Boolean expression for the layout.

16. The computer-readable storage medium of claim 12, the method further comprising representing multiple layers in the layout by reflecting Gray code numbers across a plane parallel to the surface of the layout and then adding zeros on one side of the plane and ones on the other side of the plane to produce a three-dimensional Gray code.

17. The computer-readable storage medium of claim 12, the method further comprising creating a Boolean function using the Boolean expression, whereby the Boolean function can be used to determine if a point is inside the shape.

18. The computer-readable storage medium of claim 17,
wherein the Boolean function receives four inputs specifying four corners that define a rectangular region R, and a fifth input specifying a point P; and
wherein the Boolean function evaluates to TRUE if the point P is contained within the rectangular region R.

19. The computer-readable storage medium of claim 12, wherein performing the operation includes performing one of, an AND operation, an OR operation, an EXCLUSIVE-OR operation, a CONTAINMENT operation, and an EQUIVALENCE operation.

20. The computer-readable storage medium of claim 19, the method further comprising defining a non-rectangular area by combining Boolean expressions of multiple rectangular areas.

21. The computer-readable storage medium of claim 12, wherein if the shape is a rectangle, the shape can be represented using coordinates for each corner of the rectangle.

22. The computer-readable storage medium of claim 12, wherein if the shape has a constant width, the shape can be represented using coordinates for each end of the shape.

23. An apparatus for representing a shape within a layout of an integrated circuit using a Boolean expression, comprising:
a receiving mechanism that is configured to receive a representation of the shape;
a converting mechanism that is configured to convert the representation into the Boolean expression, wherein the Boolean expression is formed using a Boolean coordinate system expressed in a two-dimensional Gray code; and
a Boolean operation mechanism that is configured to perform an operation on the shape by performing a Boolean operation on the Boolean expression for the shape.

24. The apparatus of claim 23, wherein the converting mechanism is configured to number points in the layout with Gray code values by:
starting with a sub-region of the layout that already has Gray code values; and
forming Gray code values for a larger sub-region of the layout by,
reflecting Gray codes values for the sub-region about a horizontal or vertical axis, and
prefixing Gray code values on one side of the axis with 0 values and prefixing Gray code values on the other side of the axis with 1 values to form Gray code values for the larger sub-region of the layout.

25. The apparatus of claim 23, wherein the converting mechanism is configured to determine the Gray code value for a point in the layout by concatenating a Gray code value for the x-coordinate for the point with a Gray code value for the y-coordinate for the point.

26. The apparatus of claim 23, further comprising an incorporating mechanism that is configured to incorporate the shape into the layout of the integrated circuit by incorporating the Boolean expression for the shape into a Boolean expression for the layout.

27. The apparatus of claim 23, wherein the converting mechanism is further configured to represent multiple layers in the layout by reflecting Gray code numbers across a plane parallel to the surface of the layout and then adding zeros on one side of the plane and ones on the other side of the plane to produce a three-dimensional Gray code.

28. The apparatus of claim 23, further comprising a function creation mechanism that is configured to create a Boolean function using the Boolean expression, whereby the Boolean function can be used to determine if a point is inside the shape.

29. The apparatus of claim 28,
wherein the Boolean function receives four inputs specifying four corners that define a rectangular region R, and a fifth input specifying a point P; and
wherein the Boolean function evaluates to TRUE if the point P is contained within the rectangular region R.

30. The apparatus of claim 23, wherein performing the operation includes performing one of, an AND operation, an OR operation, an EXCLUSIVE-OR operation, a CONTAINMENT operation, and an EQUIVALENCE operation.

31. The apparatus of claim 23, further comprising a defining mechanism that is configured to define a non-rectangular area by combining Boolean expressions of multiple rectangular areas.

32. The apparatus of claim 23, wherein if the shape is a rectangle, the shape can be represented using coordinates for each corner of the rectangle.

33. The apparatus of claim 23, wherein if the shape has a constant width, the shape can be represented using coordinates for each end of the shape.

* * * * *